(12) United States Patent
Chang

(10) Patent No.: US 9,281,018 B2
(45) Date of Patent: Mar. 8, 2016

(54) SEMICONDUCTOR MEMORY

(71) Applicant: Winbond Electronics Corp., Taichung (TW)

(72) Inventor: Kuen-Huei Chang, Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/341,116

(22) Filed: Jul. 25, 2014

(65) Prior Publication Data

US 2016/0027479 A1    Jan. 28, 2016

(51) Int. Cl.
*G11C 5/06* (2006.01)
*G11C 7/10* (2006.01)
*G11C 7/06* (2006.01)
*G11C 7/12* (2006.01)

(52) U.S. Cl.
CPC .. *G11C 5/06* (2013.01); *G11C 7/06* (2013.01); *G11C 7/10* (2013.01); *G11C 7/12* (2013.01)

(58) Field of Classification Search
CPC ....... G11C 6/06; G11C 7/1069; G11C 7/1096
USPC .............................................. 365/63, 189.17
See application file for complete search history.

(56) References Cited

U.S. PATENT DOCUMENTS

| | | | | |
|---|---|---|---|---|
| 5,949,732 A | * | 9/1999 | Kirihata | 365/230.03 |
| 6,477,074 B2 | * | 11/2002 | Kikutake et al. | 365/51 |
| 7,085,171 B2 | * | 8/2006 | Song | 365/189.02 |

* cited by examiner

*Primary Examiner* — Hoai V Ho
*Assistant Examiner* — Tri Hoang
(74) *Attorney, Agent, or Firm* — Muncy, Geissler, Olds & Lowe, P.C.

(57) ABSTRACT

Semiconductor memories are provided. The Semiconductor memory includes a plurality of sense amplifiers, plurality sets of master data line segments and a plurality of memory segments. The plurality sets of master data line segments are arranged in a column direction. Each memory segment includes a plurality of memory cells, and is coupled to a set of corresponding master data line segments via a corresponding sense amplifier. Adjacent sets of corresponding master data line segments are coupled together. When accessing memory data, the memory data are transferred by the adjacent sets of corresponding master data line segments which are coupled together.

7 Claims, 4 Drawing Sheets

SEMICONDUCTOR MEMORY

BACKGROUND OF THE INVENTION

1. Field of the Invention

The present invention relates to semiconductor circuits, and in particular relates to a memory device and method thereof.

2. Description of the Related Art

Almost all electronic devices contain Memory for data storage. Memories are typically implemented by semiconductor circuits. Various types of memory are employed in modern electronic devices. Examples of memory include, but are not limited to DRAM.

Traditional memory requires large numbers of routing for accessing and storing mass data. The invention provides a semiconductor memory which effectively reduces routing and circuit area, thereby decreasing manufacturing cost.

BRIEF SUMMARY OF THE INVENTION

A detailed description is given in the following embodiments with reference to the accompanying drawings.

An embodiment of a semiconductor memory is disclosed, comprising a plurality of sense amplifiers, plurality sets of master data line segments and a plurality of memory segments. The plurality sets of master data line segments are arranged in a column direction. Each memory segment comprises a plurality of memory cells, and is coupled to a set of corresponding master data line segments via a corresponding sense amplifier. Adjacent sets of corresponding master data line segments are coupled together. When accessing memory data, the memory data are transferred by the adjacent sets of corresponding master data line segments which are coupled together.

Another embodiment of a semiconductor memory is provided, comprising a plurality of input/output (IO) ports, a global data bus, and a plurality of memory banks. The global data bus is coupled to the plurality of IO ports to access memory data. Each memory bank comprises a plurality of sense amplifiers, plurality sets of master data line segments and a plurality of memory segments. The plurality sets of master data line segments are arranged in a column direction. Each memory segment comprises a plurality of memory cells, and is coupled to a set of corresponding master data line segments via a corresponding sense amplifier. Adjacent sets of corresponding master data line segments are coupled together. When accessing the memory data, the memory data are transferred by the adjacent sets of corresponding master data line segments which are coupled together.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
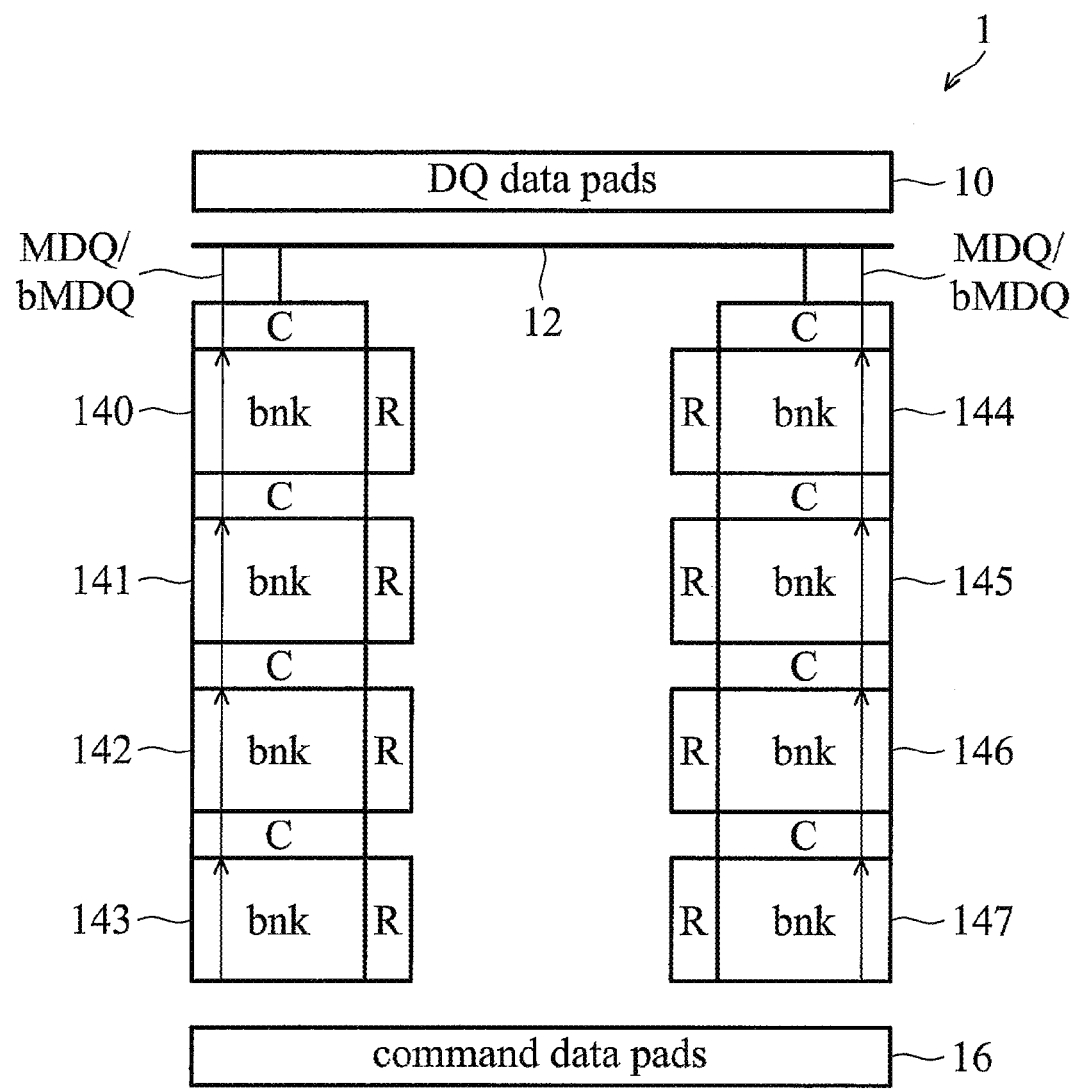
FIG. 1 is a circuit schematic of a section of a semiconductor memory 1 according to an embodiment of the invention.

FIG. 1 is a circuit schematic of a section of a semiconductor memory 1 according to an embodiment of the invention, including DQ data pads 10, a global data bus 12, a plurality of memory banks 140, 141, . . . , 147, and command pads 16. The DQ data pads 10 is coupled to the global data bus 12, the plurality of memory banks 140 through 147, and subsequently to the command data pads 16.

The DQ data pads 10 include a plurality of memory data pads. Memory data are transferred to and from the semiconductor memory 1 via the DQ data pads 10. The command data pads 16 include a plurality of command data pads to receive a command data such as a write or read command. The command data pads 16 are coupled to the memory banks 140 through 147 to manage reading, writing, or other data processing of the memory banks 140 through 147.

Figure 2:
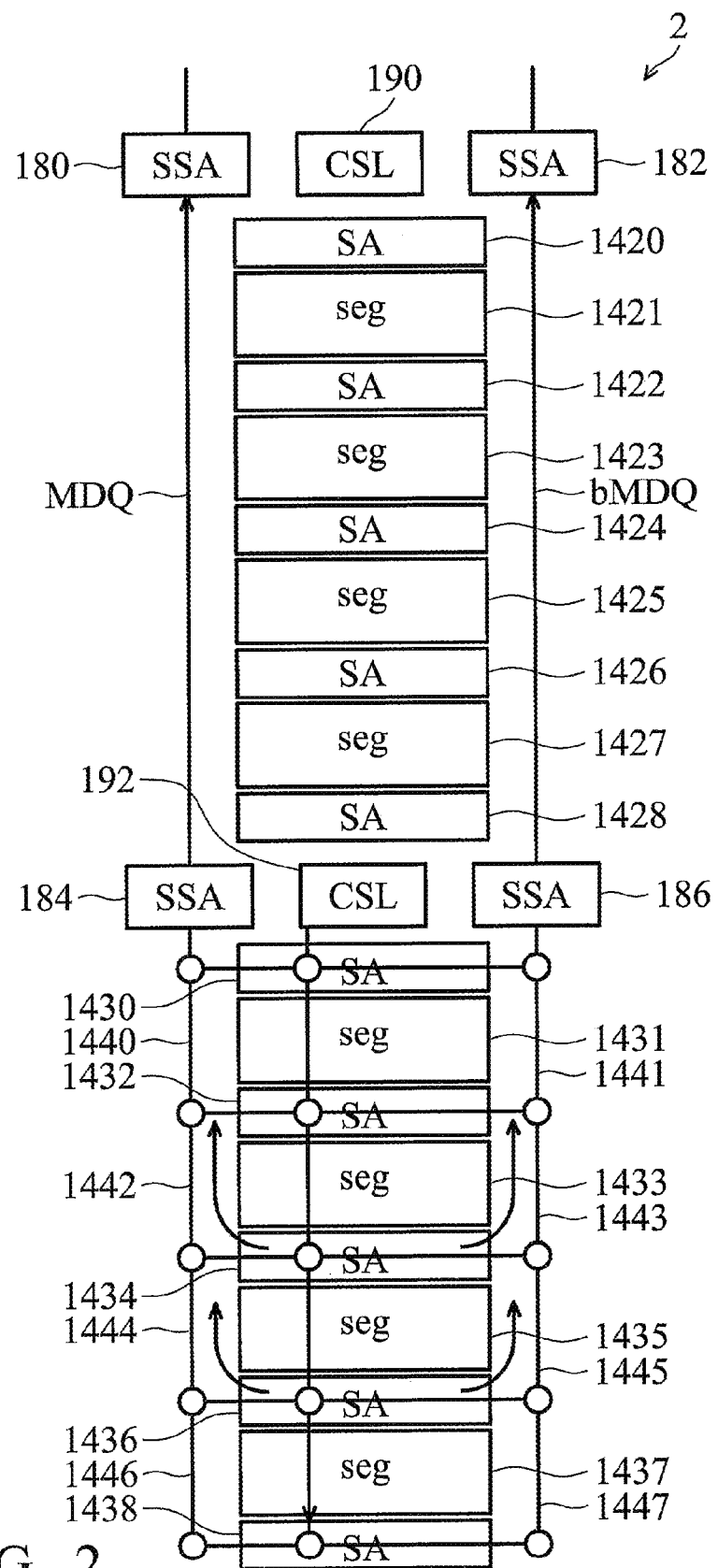
FIG. 2 is a schematic diagram of a memory block 2 according to an embodiment of the invention.

Each of the memory banks 140 through 147 contains a plurality of memory cells (not shown) for storing memory data. The plurality of memory cells are activated or deactivated by bit lines (not shown) along columns C and word lines (not shown) along rows R to control data access. Further, each memory bank includes a plurality of columns; each column includes a pair of master data lines MDQ/bMDQ and a column control line CSL (not shown). For example, each memory bank may include 128 columns. FIG. 2 shows a part of a column of the memory bank in FIG. 1.

The master data lines MDQ/bMDQ are data transmission lines which run through all adjacent memory banks along the column direction via secondary sense amplifiers (not shown) and transfer the memory data of the memory banks 140 through 147. For example, the memory banks 140 through 143 on the left-half are run through by the master data lines MDQ/bMDQ via corresponding secondary sense amplifiers to access memory data in the memory cells of the memory banks 140 through 143; the memory banks 144 through 147 on the right-half are run through by the master data lines MDQ/bMDQ via corresponding secondary sense amplifiers to access memory data in the memory cells of the memory banks 144 through 147. Each of the master data lines MDQ and bMDQ serves to transmit memory data between the global data bus 12 and the memory banks 140 through 147. The master data lines MDQ/bMDQ are a pair of data transmission lines MDQ and bMDQ. In certain embodiments, when the memory cells are idle, the master data lines MDQ and bMDQ carry logic "HIGH" data; when writing or reading logic "HIGH" data to or from the memory cells, the master data line MDQ carries logic "HIGH" data and the master data line bMDQ carries logic "LOW" data; when writing or reading logic "low" data to or from the memory cells, the master data line MDQ carries logic "LOW" data and the master data line bMDQ carries logic "HIGH" data.

Each memory bank is further controlled by a dedicated column control line CSL which carries a column control signal thereon to respectively enable or disable a corresponding column of the memory banks. When the CSL signal is utilized to enable a specific column of a specific memory bank, the memory cells in the specific column of the specific memory bank may be accessed. When the CSL signal is utilized to disable the specific column of the specific memory bank, the memory cells in the specific column of the specific memory bank may be prevented from being accessed. Each data access enables only a specific column of a specific memory bank. For example, when the CSL signal enables the first column of the memory bank 143, the first columns of the memory banks 140 through 142 and the memory banks 144 through 147 are disabled by their dedicated CSL signals. As a result, only the memory cells in the first column of the memory bank 143 may be accessed through the master data lines MDQ/bMDQ.

The plurality of memory banks 140 through 147 are coupled to the global data bus 12 via the master data lines MDQ/bMDQ. The global data bus 12 is coupled to the DQ data pads 10. All memory data in the semiconductor memory 1 are accessed via the global data bus 12.

In FIG. 1, only two master data lines MDQ and bMDQ are shown on the memory banks 140 through 143 of the left-half and the memory banks 144 through 147 of the right-half, in practice, the adjacent memory banks on each half include a plurality of master data lines MDQ and bMDQ which run through the memory banks vertically via corresponding secondary sense amplifiers. When reading data, memory data in each memory cell of the memory banks are transferred to the global data bus 12 via the plurality of master data lines MDQ and bMDQ and the corresponding secondary sense amplifiers and output from the DQ data pads 10; when writing data, memory data are transferred from the global data bus 12 via the plurality of master data lines MDQ and bMDQ and the corresponding secondary sense amplifiers and output from the DQ data pads 10 into each memory cell of the memory banks for data storage.

Since the semiconductor 1 transfers memory data between the memory banks and the global data bus 12 via the master data lines MDQ/bMDQ which run through all adjacent memory banks, wiring and routing area between the memory banks and the global data bus 12 can be reduced, leading to reduction in manufacturing cost of the semiconductor memory.

FIG. 2 is a schematic diagram of a memory block 2 according to an embodiment of the invention, including same columns of two memory banks which contain a plurality of sense amplifiers (SA) 1420, 1422, . . . , 1438, a plurality sets of master data line segments, a plurality of memory segments 1421, 1423, . . . , 1437, column control lines (CSL) 190 and 192, and secondary sense amplifiers (SSA) 180, 182, 184, 186. The plurality of SA 1420, 1422, . . . , 1428, the plurality sets of master data line segments, the plurality of memory segments 1421, 1423, . . . , 1427, the SSA 180 and 182, and the CSL 190 belong to an upper-half of the memory banks; the plurality of SA 1430, 1432, . . . , 1438, the plurality sets of master data line segments, the plurality of memory segments 1431, 1433, . . . , 1437, the SSA 184 and 186, and the CSL 192 belong to a lower-half of the memory banks.

Firstly, please refer to the lower-half, the master data lines MDQ/bMDQ are laid out along the column direction, the left data line is the master data line MDQ and the right data line is the master data line bMDQ. The master data lines MDQ/bMDQ include the plurality sets of master data line segments. Each set of master data line segments contains two local master data lines (only the local master data lines 1440 through 1447 are labeled in the lower-half of the local master data lines in FIG. 2). The memory banks may operate by a sensing mode or a re-driver mode. In the sensing mode, the master data lines MDQ/bMDQ carry a set of differential signals; whereas in the re-driver mode, one of the master data lines MDQ/bMDQ carries a data signal to be transmitted to an adjacent memory bank. Each memory segment 1431, 1433, . . . , 1437 contains a plurality of memory cells (not shown) which serve to store memory data. Each memory segment is coupled to a corresponding set of master data line segments through a corresponding sense amplifier, each two adjacent sets of master data line segments are coupled together. All adjacent sets of master data line segments are coupled together to form the master data lines MDQ/bMDQ which run through all adjacent memory banks. The master data lines MDQ/bMDQ serve as a data path for data transmission between the memory cells of each memory bank and the global data bus 12. Take the memory segment 1435 as an example, the memory segment 1435 is coupled to the corresponding local master data lines 1444 and 1445 via the corresponding sense amplifier 1436, the adjacent local master data lines 1442, 1444, and 1446 are coupled together, and the adjacent local master data lines 1443, 1445, and 1447 are coupled together. All adjacent local master data lines 1440, 1442, 1444 and 1446, and the local master data lines of other memory banks are coupled together to form the master data line MDQ. All adjacent local master data lines 1441, 1443, 1445 and 1447, and the local master data lines of other memory banks are coupled together to form the master data line bMDQ. The master data lines MDQ/bMDQ are directly coupled to the global data bus 12, and serve to access the memory segments the master data lines MDQ/bMDQ run through.

In some embodiments, the adjacent local master data lines are coupled together via a sense amplifier. Take the memory segment 1435 as an example, the adjacent local master data lines 1442 and 1444 are coupled together via the sense amplifier 1434, the adjacent local master data lines 1444 and 1446 are coupled together via the sense amplifier 1436, the adjacent local master data lines 1443 and 1445 are coupled together via the sense amplifier 1434, and the adjacent local master data lines 1445 and 1447 are coupled together via the sense amplifier 1436.

As stated in the preceding paragraphs for FIG. 1, each column of each memory bank includes a dedicated column control line CSL which carries a CSL signal controlling all memory cells on the column of the memory bank. When accessing memory data in the column of the lower-half memory bank, the column control line 192 is utilized to enable all memory cells on the column of the lower-half memory bank, and access the plurality of memory cells by the master data lines MDQ/bMDQ. For example, when writing memory data into the lower-half memory bank, the memory data to be written will be input from the DQ data pads 10 to the global data bus 12, the memory segments 1431 through 1437 will be enabled by the column control line 192, the memory segments 1421 through 1427 will be disabled by the column control line 190, the memory cells in the memory segments 1431 through 1437 to be written are activated by the word lines and bit lines, and the memory data are written into the activated memory cells from the global data bus 12 through the master data lines MDQ/bMDQ and the secondary sense amplifiers 180 through 186, wherein the master data lines MDQ/bMDQ are formed by local master data lines being coupled together. When reading memory data from the lower-half memory bank, the memory segments 1431 through 1437 will be enabled by the column control line 192, the memory segments 1421 through 1427 will be disabled by the column control line 190, the memory cells in the memory segments 1431 through 1437 to be read are activated by the word lines and bit lines, and the memory data are read from the activated memory cells via the master data lines MDQ/bMDQ formed by local master data lines being coupled together and the secondary sense amplifiers 180 through 186, the memory data are then sent to the global data bus 12 and output from the DQ data pads 10.

Figure 3:
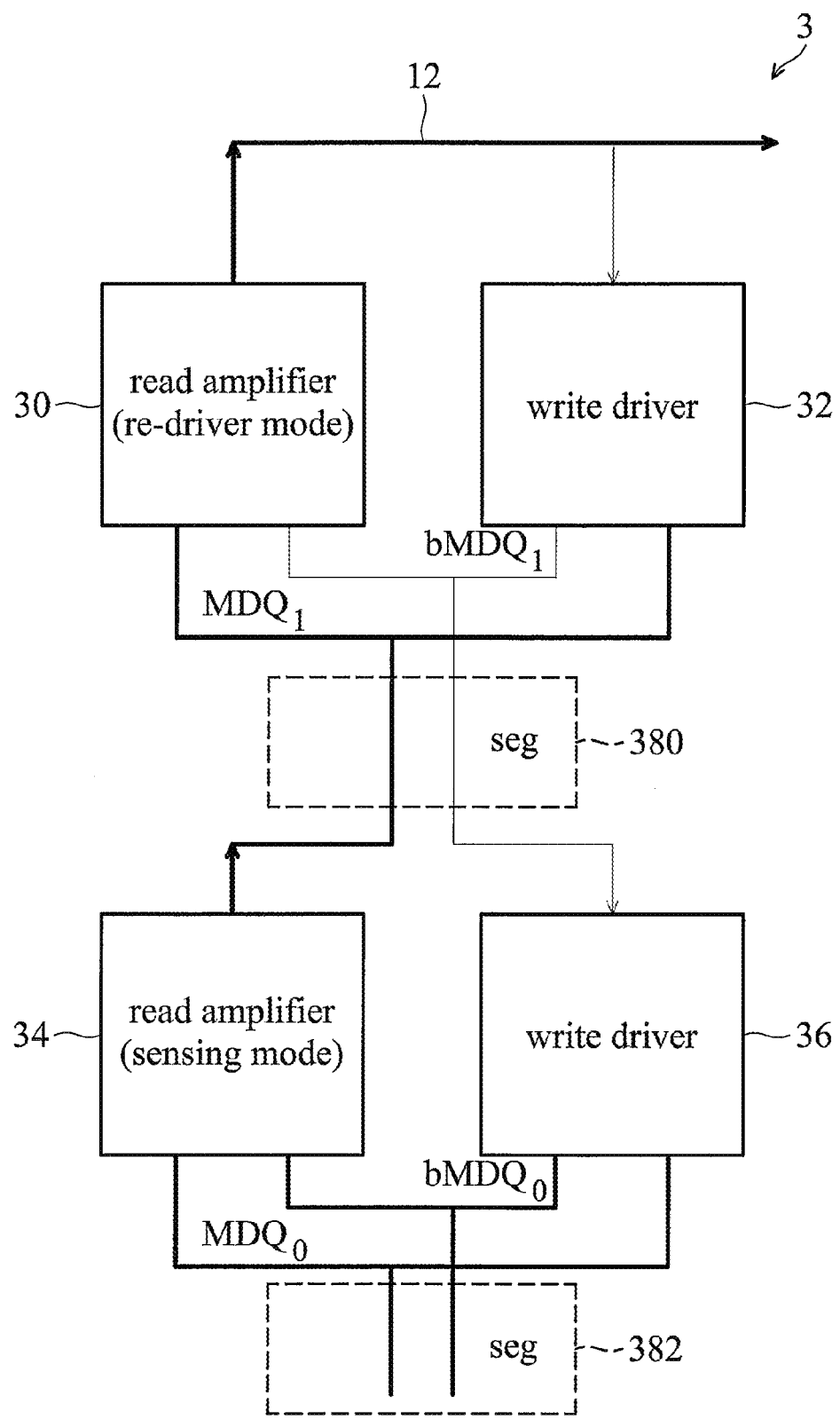
FIG. 3 is a schematic diagram of a memory segment 3 in a read operation according to an embodiment of the invention.

FIG. 3 is a schematic diagram of a memory segment 3 in a read operation according to an embodiment of the invention, the memory segment 3 includes a read amplifier 30 (sense amplifier), a write driver 32, a read amplifier 34 (sense amplifier), a write driver 36, and memory segments 380 and 382.

The read amplifiers 30 and 34 may operate by a sense mode or a re-driver mode, and convert input memory data from analog to digital. In the sense mode, the read amplifier may read analog memory data from a corresponding memory segment via two local master data lines, and convert the read memory data into digital memory data, and transmit the digital memory data from one of two next-stage local master data lines. In the re-driver mode, the read amplifier can read digital memory data from one of two local master data lines, and directly pass the read and digital memory data to one of two next-stage local master data lines, or directly pass the digital memory data to the local data bus 12.

For example, when reading data from the memory segment 382, the read amplifier 34 is operated with the sense mode. The read amplifier 34 reads analog memory data from local master data lines $MDQ_0$ and $bMDQ_0$, converts the read memory data into digital memory data, and transmits the digital memory data only from a next-stage local master data line $MDQ_1$ via adjacent memory segment 380 to the next-stage read amplifier 30. The read amplifier 30 is operated with the re-driver mode. The read amplifier 30 reads digital memory data only from the local master data lines $MDQ_1$ enhances and transmits the read digital memory data from a next-stage local master data line $MDQ_1$ to the global data bus 12.

Figure 4:
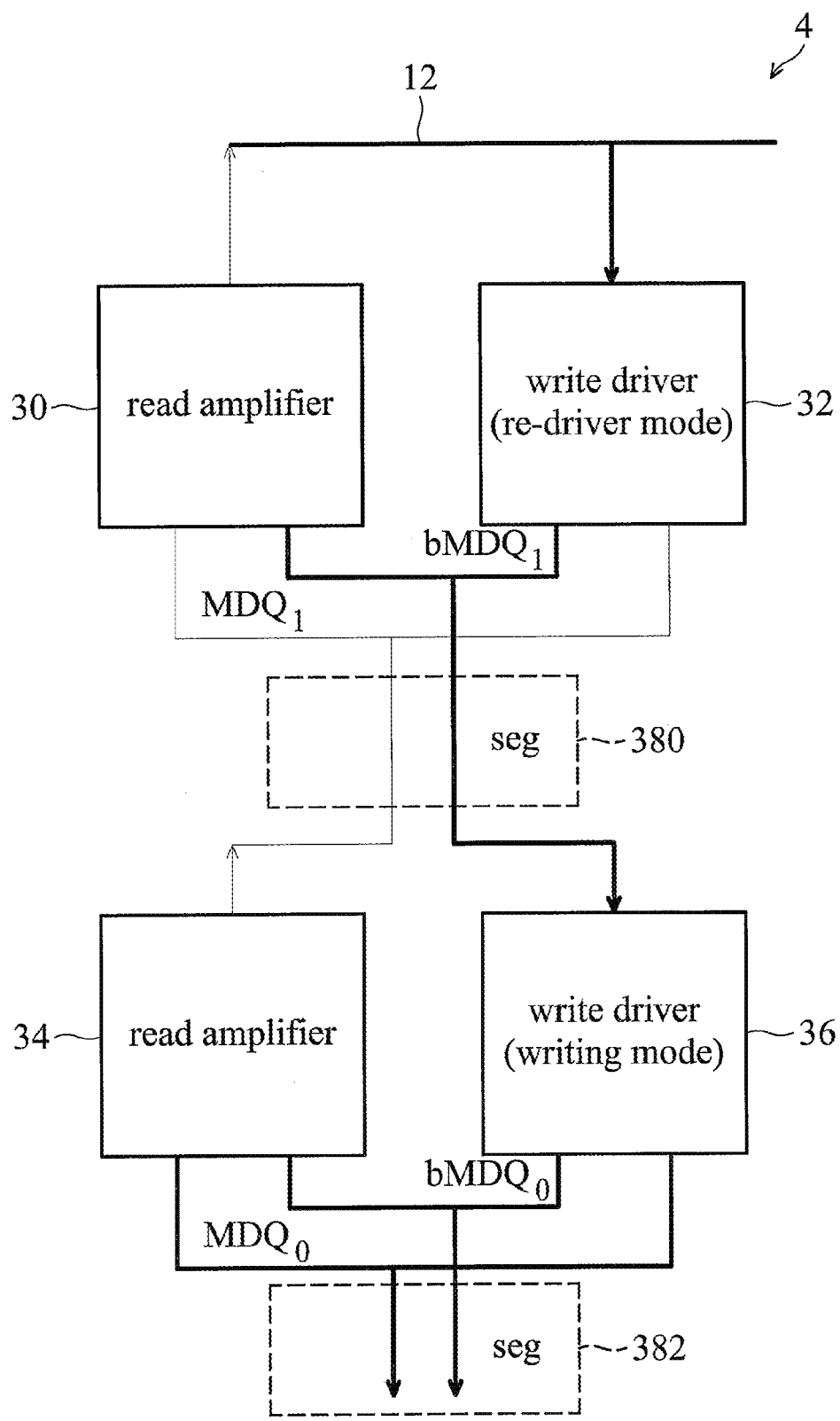
FIG. 4 is a schematic diagram of a memory segment 4 in a write operation according to an embodiment of the invention.

FIG. 4 is a schematic diagram of a memory segment 4 in a write operation according to an embodiment of the invention, the memory segment 4 includes a read amplifier 30 (sense amplifier), a write driver 32, a read amplifier 34 (sense amplifier), a write driver 36, and memory segments 380 and 382.

The write drivers may operate by a writing mode or a re-driver mode and convert input memory data from digital to analog. In the writing mode, the write drivers can convert the digital memory data into analog memory data, and write the analog memory data into a written memory segment via two local master data lines. In the re-driver mode, the write drivers can read digital memory data from only one of the two local master data lines, and directly pass the read digital memory data to one of two next-stage local master data lines.

For example, when writing data into the memory segment 382, the write driver 32 is operated with the re-driver mode. The write driver 32 reads digital memory data from the global data bus 12, and transmits the digital memory data only from a local master data line $MDQ_1$ to the next-stage write driver 36. The write driver 36 is operated with the writing mode, converts the digital memory data into analog memory data, and stores the memory data into corresponding memory segment 382 via two local master data lines $MDQ_0$ and $bMDQ_0$.

Referring now to FIGS. 3 and 4, in certain embodiment, in the re-driver mode, the read amplifier and write driver output data from different local master data lines MDQ and bMDQ. For example, the read amplifier utilizes the local master data lines MDQ for outputting data in the re-driver mode, whereas the write driver utilizes the local master data lines bMDQ for outputting data in the re-driver mode As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The term "or" used herein is intended to mean an inclusive "or" rather than an exclusive "or." That is, unless specified otherwise, or clear from the context, the phrase "X employs A or B" is intended to mean any of the natural inclusive permutations. In addition, the articles "a" and "an" as used in this application and the appended claims should generally be construed to mean "one or more" unless specified otherwise or clear from the context to be directed to a singular form.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory, comprising:
   a plurality of sense amplifiers;
   a plurality sets of master data line segments, arranged in a column direction; and
   a plurality of memory segments, each comprises a plurality of memory cells, and is coupled to a set of corresponding master data line segments via a corresponding sense amplifier;
   wherein adjacent sets of corresponding master data line segments are coupled together via the corresponding sense amplifier;
   each set of corresponding master data line segments comprises two local master data lines;
   when accessing memory data, the memory data are transferred by the adjacent sets of corresponding master data line segments which are coupled together; and
   during a read operation, a first corresponding sense amplifier of a memory segment which has not been accessed transfers the memory data via only one of the two local master data lines.

2. The semiconductor memory of claim 1, further comprising:
   a plurality of write driver circuit;
   wherein each memory segment is coupled to the set of corresponding master data line segments via a corresponding write driver circuit;
   wherein adjacent sets of corresponding master data line segments are coupled together via the corresponding write driver circuit; and during a write operation, a first corresponding write driver circuit transfers the memory data via the other one of the two local master data lines.

3. The semiconductor memory of claim 1, further comprising:
a plurality of input/output (IO) ports; and
a global data bus, coupled to the plurality of IO ports to access the memory data;
wherein one set of master data line segments are coupled to the global data bus.

4. The semiconductor memory of claim 1, further comprising:
a plurality of memory banks, wherein each memory bank comprises the plurality of sense amplifier, the plurality sets of master data line segments, the plurality of memory segments, and a column select line;
wherein the column select line runs through the plurality of memory segments of each memory bank along the column direction;
when accessing the memory cells of one of the plurality of memory banks, the column select line thereof is enabled, while the column select lines of remaining memory banks are disabled.

5. A semiconductor memory, comprising:
a plurality of input/output (JO) ports
a global data bus, coupled to the plurality of JO ports to access memory data; and
a plurality of memory banks, each memory bank comprising:
a plurality of sense amplifiers;
a plurality sets of master data line segments, arranged in a column direction; and
a plurality of memory segments, each comprises a plurality of memory cells, and is coupled to a set of corresponding master data line segments via a corresponding sense amplifier;
wherein adjacent sets of corresponding master data line segments are coupled together via the corresponding sense amplifier;
each set of corresponding master data line segments comprises two local master data lines;
when accessing the memory data, the memory data are transferred by the adjacent sets of corresponding master data line segments which are coupled together; and
during a read operation, a first corresponding sense amplifier of a memory segment which has not been accessed transfers the memory data via only one of the two local master data lines.

6. The semiconductor memory of claim 5, further comprising:
a plurality of write driver circuit;
wherein each memory segment is coupled to the set of corresponding master data line segments via a corresponding write driver circuit;
wherein adjacent sets of corresponding master data line segments are coupled together via the corresponding write driver circuit; and
during a write operation, a first corresponding write driver circuit transfers the memory data via the other one of the two local master data lines.

7. The semiconductor memory of claim 5, further comprising:
a plurality of memory banks, wherein each memory bank comprises the plurality of sense amplifier, the plurality sets of master data line segments, the plurality of memory segments, and a column select line;
wherein the column select line runs through the plurality of memory segments of each memory bank along the column direction;
when accessing the memory cells of one of the plurality of memory banks, the column select line thereof is enabled, while the column select lines of remaining memory banks are disabled.

* * * * *